(12) United States Patent
Morimoto et al.

(10) Patent No.: US 7,902,043 B2
(45) Date of Patent: Mar. 8, 2011

(54) METHOD OF PRODUCING BONDED WAFER

(75) Inventors: Nobuyuki Morimoto, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 379 days.

(21) Appl. No.: 11/855,959

(22) Filed: Sep. 14, 2007

(65) Prior Publication Data

US 2008/0070377 A1 Mar. 20, 2008

(30) Foreign Application Priority Data

Sep. 15, 2006 (JP) ................................. 2006-251252

(51) Int. Cl.
*H01L 21/30* (2006.01)

(52) U.S. Cl. ................. 438/458; 438/459; 257/E21.122

(58) Field of Classification Search .................. 438/455, 438/458–459; 257/E21.122
See application file for complete search history.

(56) References Cited

U.S. PATENT DOCUMENTS

| 4,597,804 | A | 7/1986 | Imaoka |
| 6,211,041 | B1 | 4/2001 | Ogura |
| 2002/0153563 | A1 | 10/2002 | Ogura |
| 2003/0170990 | A1* | 9/2003 | Sakaguchi et al. ............ 438/690 |
| 2004/0072409 | A1 | 4/2004 | Fitzgerald et al. |
| 2004/0087109 | A1 | 5/2004 | McCann et al. |

FOREIGN PATENT DOCUMENTS

| EP | 0889510 | 1/1999 |
| JP | 05-021128 | 1/1993 |
| JP | 08-264398 | 10/1996 |
| JP | 11-307747 | 11/1999 |
| JP | 2000-036445 | 2/2000 |
| JP | 2000-178098 | 6/2000 |

OTHER PUBLICATIONS

European Search Report from related European Application Serial No. EP07018101, mailed Jan. 29, 2008.
Korean Intellectual Property Office, "Notice of Preliminary Rejection" for Korean application No. 10-2007-0090933, issue date Feb. 20, 2009 (8 pages, including English-language translation). This Korean application is a counterpart of U.S. Appl. No. 11/855,959.
Kiyoshi Miki, "Bonded SOI Substrate," in Science of Silicon (chapter 6 section 3), edited by UCS Semiconductor basic technology workshop, published by Realize, Inc, pp. 459 to 461 translated into English, Jun. 28, 1996 (5 pages in English). This reference is an amended translation of the version submitted in the IDS of Nov. 9, 2007. This citation also revises the page range, which was incorrectly listed the previous IDS.
European Patent Office, Examination Report for EP 07018101.1, dated Aug. 26, 2009 (4 pages). The EP 07018101.1 application is a counterpart of U.S. Appl. No. 11/855,959.
Miki, Kiyoshi, "Bonded SOI Substrate," Science of Silicon, Published by Realize Inc., Chapter 6, Section 3, pp. 259-261, Jun. 28, 1996.

* cited by examiner

*Primary Examiner* — Thanhha Pham
(74) *Attorney, Agent, or Firm* — Kolisch Hartwell, P.C.

(57) ABSTRACT

A method of producing a bonded wafer, comprising: performing bonding of a first semiconductor wafer and a second semiconductor wafer without interposing an insulation film in between; and performing thinning of the second semiconductor wafer, wherein surface portions at least including bonded surfaces of the first semiconductor wafer and the second semiconductor wafer have an oxygen concentration of $1.0 \times 10^{18}$ atoms/cm$^3$ (Old ASTM) or less.

8 Claims, 2 Drawing Sheets

500 μm

500 μm

100 μm

100 μm

500 μm

METHOD OF PRODUCING BONDED WAFER

BACKGROUND OF THE INVENTION

1. Field of the Invention

The present invention relates to a method of producing a bonded wafer by bonding a wafer for an active layer and a wafer for a substrate without interposing an insulation film in between, and thinning the wafer for the active layer.

Priority is claimed on Japanese Patent Application No. 2006-251252, filed Sep. 15, 2006, the content of which is incorporated herein by reference.

2. Description of Related Art

In general a bonded wafer denotes an SOI (Silicon On Insulator) wafer. For example, the below described methods are disclosed as methods of producing a bonded wafer. In a method (grinding-polishing method) described in Non Patent Reference 1 (Science of silicon, edited by UCS semiconductor basic technology workshop, Realize Inc., Jun. 28, 1996, p 459-462), after bonding a non-oxidized wafer for a substrate and an oxidized wafer for an active layer, the oxidized wafer for the active layer is made into a thin film of a predetermined thickness by grinding and polishing the surface of the wafer. An ion implantation separation method described in Patent Reference 1 (Japanese Unexamined Patent Application, First Publication, No. H5-21128) comprises a step of forming an ion-implanted layer by implanting light element ions such as $H_2$ ions or He ions to a predetermined depth in the wafer for an active layer, a step of bonding the wafer for the active layer and the wafer for the substrate interposing an insulation film in between, a step of delaminating the wafer at the above-described ion-implanted layer, and a step of forming an active layer of a predetermined thickness by thinning an active layer portion exposed by the delamination. In addition, a bonded wafer may be produced by so-called Smart-cut method (registered trademark).

A novel type of bonded wafer is proposed as a wafer used for semiconductor devices of the next generation exhibiting low electric power consumption. For example, Patent Reference 2 (Japanese Unexamined Patent Application, First Publication, No. 2000-36445) shows a bonded wafer in which an insulation layer is not interposed between the wafer for an active layer and the wafer for the substrate. This type of wafer is considered as an advantageous wafer in terms of the simplification of production process of a composite crystal substrate and improvement of performance of the substrate. In the method described in Patent Reference 2, after bonding the wafers having a natural oxide film, the wafer for the active layer is made into a thin layer. After that, the bonded wafer is subjected to a heat treatment, thereby forming a bonded interface in which an insulation film is not interposed.

However, in the bonded wafer produced by the above-described method of Patent Reference 2, there have been problems in that the natural oxide film in the bonded interface locally aggregated to form island oxides during the fabrication process of a bonded wafer and numerous island oxides remain in the bonded interface. The presence of these oxides causes a deterioration of device properties. In the production process of a semiconductor device, the island oxides behave as nuclei for defects, thereby causing reduction of yield, for example, because of unsatisfactory chips.

Patent Reference 3 (Japanese Unexamined Patent Application, First Publication No. H8-264398) describes a method for reducing island oxides (oxide islands) in the bonded interface. In this method, before bonding wafers, surface natural oxide films are removed from the wafers by dipping the wafers in a solution of HF or the like.

However the method of Patent Reference 3 includes problems. For example, even though the surface oxide film are removed from wafers oxygen atoms in the interior of the substrate locally condense to the bonded interface and form oxides. Therefore, the reduction of island oxides cannot be performed sufficiently.

An object of the invention is to provide a method of producing a bonded wafer by bonding a wafer for an active layer and a wafer for a substrate without interposing an insulation layer in between, where a formation of island oxides is suppressed by controlling oxygen concentrations in surface portions at least including bonded surfaces of the wafers.

SUMMARY OF THE INVENTION

A first aspect of the present invention is a method of producing a bonded wafer, comprising:

performing bonding of a first semiconductor wafer and a second semiconductor wafer without interposing an insulation film in between; and performing thinning of the second semiconductor wafer, wherein surface portions at least including bonded surfaces of the first semiconductor wafer and the second semiconductor wafer have an oxygen concentration of $1.0 \times 10^{18}$ atoms/$cm^3$ (Old ASTM) or less.

In the above-described method, the first semiconductor wafer may be a semiconductor wafer constituting a substrate (supporting substrate) of a semiconductor device (wafer for a substrate), and the second semiconductor wafer may be a semiconductor wafer constituting an active layer of a semiconductor device (wafer for an active layer).

A second aspect of the preset invention is a method of producing a bonded wafer according to the above-described first aspect, wherein the first semiconductor wafer and the second semiconductor wafer are high-temperature-annealed wafers which have been subjected to a heat treatment at a temperature of 1000° C. or more in an Ar gas or $H_2$ gas atmosphere.

A third aspect of the present invention is a method of producing a bonded wafer according to the first aspect, wherein the second semiconductor wafer is a SOI wafer having an insulation layer and an active layer, and an oxygen concentration of the active layer of the SOI wafer is $1.0 \times 10^{18}$ atoms/$cm^3$ (Old ASTM) or less.

A fourth aspect of the present invention is a method of producing a bonded wafer according to any one of the above-described first, second or third aspect, wherein the first semiconductor wafer and the second semiconductor wafer have different crystal orientations.

A fifth aspect of the present invention is a method of producing a bonded wafer according to any one of the above-described first to fourth aspects, wherein bonded surfaces of the first semiconductor wafer and the second semiconductor wafer are hydrophobic surfaces.

A sixth aspect of the present invention is a method of producing a bonded wafer according to any one of the above-described first to fifth aspects, wherein the thinning of the second semiconductor wafer is performed by an ion implantation separation method.

According to the present invention, it is possible to produce a bonded wafer while controlling the oxygen concentration of the surface portion at least including the bond surface of each of the first semiconductor wafer and the second semiconductor wafer to be $1.0 \times 10^{18}$ atoms/$cm^3$ (Old ASTM) or less. As a result, it is possible to inhibit a formation of island oxides in the bonded interface.

BRIEF DESCRIPTION OF THE DRAWINGS

FIG. 2A shows Example 1, FIG. 2B shows Example 2, FIG. 2C shows Example 3, FIG. 2D shows Example 4, and FIG. 2E shows Comparative Example 1.

DETAILED DESCRIPTION OF THE INVENTION

Figure 1:
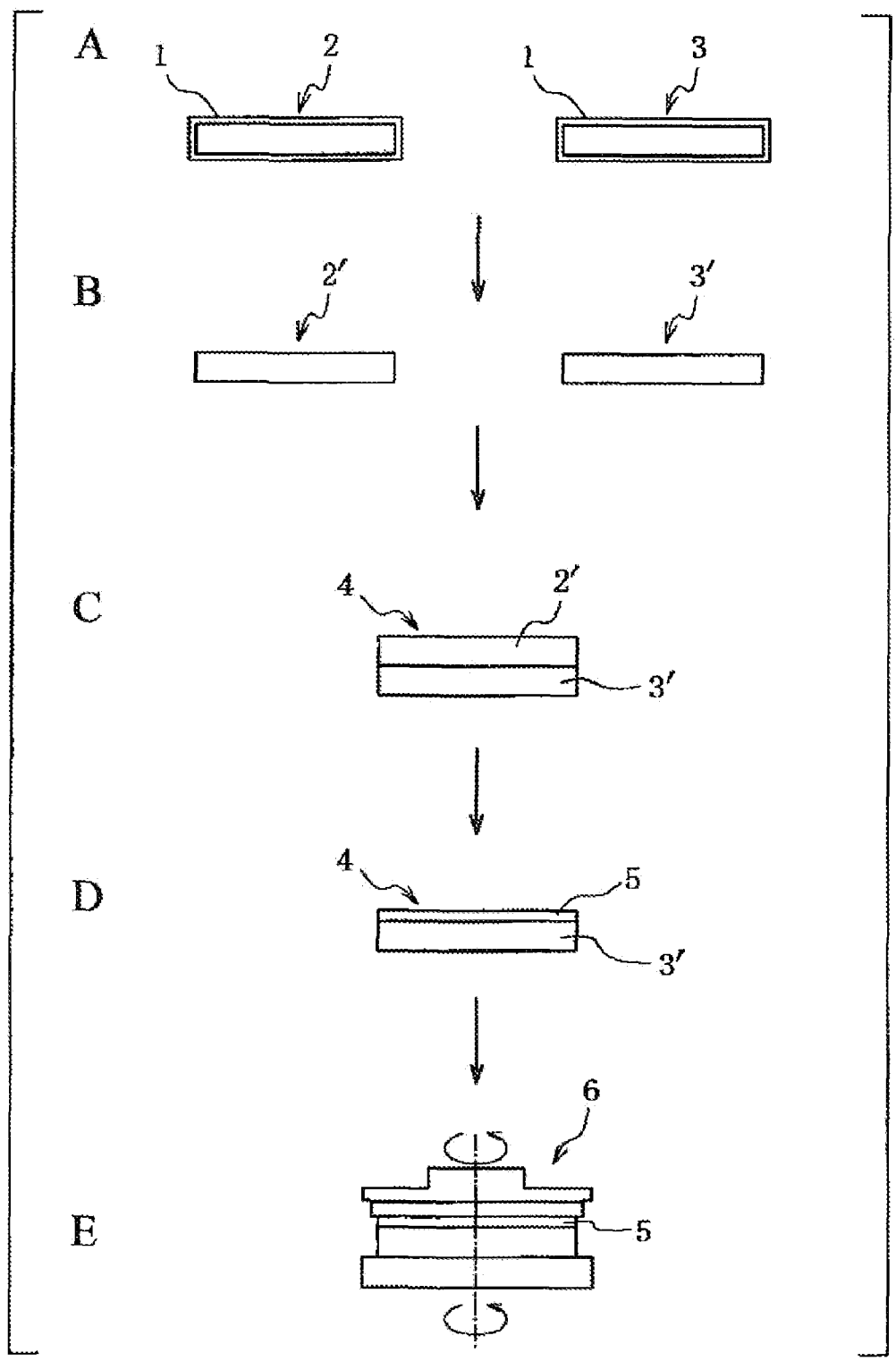
FIG. 1 is a flow chart for explaining a production process of a bonded wafer in accordance with the method of producing a bonded wafer according to the present invention. A shows a wafer for an active layer and a wafer for a substrate. B shows the wafer for an active layer and the wafer for a substrate which have been subjected to a heat treatment in Ar gas or a $H_2$ gas atmosphere and/or removal of natural oxide film in a HF solution. C shows a state of bonding the two wafers shown in B. D shows a state of the bonded wafer after removing a portion of the wafer for an active layer by grinding or by delamination. E shows a polishing state of the active layer of the bonded wafer.
Figure 2A:
FIGS. 2A-E are photographs obtained by showing results of observation of occurrence of island oxides formed in the bonded interfaces of Examples 1 to 4 and Comparative Example 1 using a laser microscope.
Figure 2B:
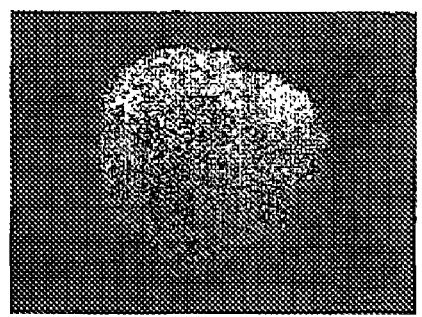
Figure 2C:
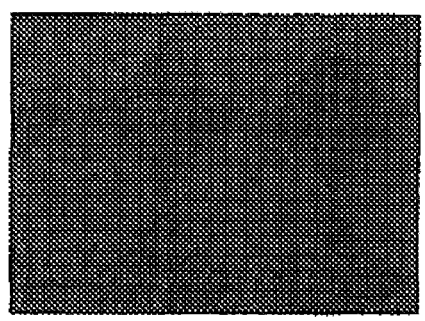
Figure 2D:
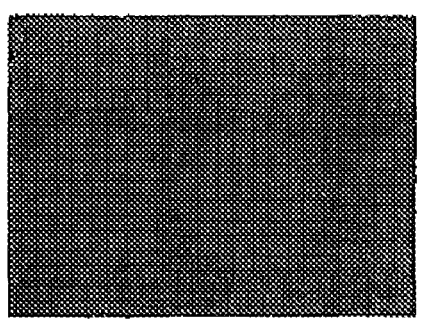
Figure 2E:
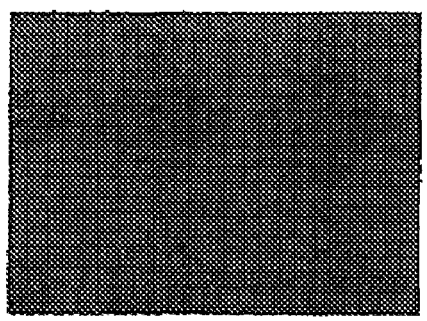

In the following, a method of producing a bonded wafer according to the present invention is explained with reference to the drawings. FIG. 1 is a flow chart for explaining production process of a bonded wafer in accordance with the production method of the present invention.

A method of producing a bonded wafer according to the present invention comprises a step of bonding a wafer for an active layer (semiconductor wafer for an active layer) and a wafer for a substrate (semiconductor wafer for a substrate) without interposing an insulation film in between, and a step of working (thinning) the wafer for an active layer into a thin film.

A conventional bonded wafer which has been produced in accordance with a method including the above-described steps included a problem in that the natural oxide film in the bonded interface locally aggregated to form island oxides in the subsequent step of producing the bonded wafer (heat treatment step) and that numerous island oxides remained in the bonded interface. After extensive investigation into the mechanism of forming the island oxides, the inventors found that, even in the case of not providing an insulation film in the bonded interface, by reducing oxygen concentrations of surface portions at least including bonded surfaces of the wafer for an active layer and a wafer for a substrate, it was possible to reduce the size of island oxides formed in the bonded interface and reduce the numbers of the island oxides.

In a practical embodiment of the production method of the present invention, as shown in FIG. 1, a wafer 2 for an active layer and a wafer 3 for a substrate each having a natural oxide film in a normal state are prepared (state A of FIG. 1). Next, by subjecting the wafers to a predetermined treatment, a wafer 2' for an active layer and a wafer 3' for a substrate are formed such that the oxygen concentration of a surface portion at least including a bond surface of each of the wafers 2', 3' is controlled to be $1.0 \times 10^{18}$ atoms/cm$^3$ (Old ASTM) or less (state B of FIG. 1). After that, the wafer 2' for an active layer is bonded to the wafer 3' for a substrate (state C of FIG. 1). After performing grinding or delamination of the active layer portion 5 of the obtained bonded wafer 4 (state D of FIG. 4), the active layer portion 5 is worked to a thin film using a polishing apparatus (state E of FIG. 1).

A silicon wafer may be applied as the semiconductor wafer constituting the wafer 2 for an active later and the wafer 3 for a substrate. It is also possible to use multilayered wafers having at least one Si layer and/or SiGe layer formed on a Si wafer sliced from a single crystal. An SOI wafer having an insulation layer and a semiconductor layer may also be used.

It is preferable that the wafer 2' for an active layer and the wafer 3' for a substrate which have been subjected to a predetermined treatment be high-temperature-annealed wafers which have been subjected to a heat treatment at a temperature of not lower than 1000° C. in an atmosphere of Ar gas, $H_2$ gas, or a mixed gas of Ar and $H_2$. By performing the above-described heat treatment, oxygen in the surface vicinity of the wafer for the active layer and the wafer for the substrate diffuse outwardly, and the oxygen concentration of the surface vicinity of the wafer is controlled to be not higher than $1.0 \times 10^{18}$ atoms/cm$^3$ (Old ASTM).

Accordingly, the method of producing a bonded wafer of the present invention may include a step of heat treating the wafer for an active layer and the wafer for a substrate at a temperature of not lower than 1000° C. in an atmosphere of Ar gas, $H_2$ gas, or a mixed gas of Ar and $H_2$. It is preferable that the heat treatment temperature be in a range from 1100° C. to 1250° C. Where the heat treatment temperature is lower than 1100° C., it is impossible to obtain a sufficient effect of outward diffusion of oxygen. On the other hand, it is preferable to use the heat treatment temperature of 1200° C. or less in order to avoid unnecessary damage. More preferably, the heat treatment temperature is in a range from 1100 to 1150° C. It is preferable that the retention for the heat treatment be controlled in a range from 10 minutes to 2 hours.

Crystal defect-free wafers may be used as the wafer for an active layer and the wafer for a substrate. By performing the above-described heat treatment on the crystal defect-free wafers thereby reducing the oxygen concentration of the surface vicinity, it is possible to obtain the wafer 2' for an active layer and the wafer 3' for a substrate that have a surface oxygen concentration of not higher than $1.0 \times 10^{18}$ atoms/cm$^3$ (Old ASTM) and are depleted in crystal defects.

Epitaxial wafers may be used as the wafer 2' for an active layer and the wafer 3' for a substrate which have been subjected to a predetermined treatment. A near-surface portion of an epitaxial layer of an epitaxial wafer has an oxygen concentration which is lower than that of the general bulk wafer and is not higher than $1.0 \times 10^{18}$ atoms/cm$^3$ (Old ASTM). Therefore, when the epitaxial wafers are used, it is not necessary to perform a heat treatment of the wafers in a high temperature gas atmosphere.

Accordingly, the method of producing a bonded wafer according to the present invention may comprise a step of forming an epitaxial layer on a surface of each of the wafer 2' for an active layer and the wafer 3' for a substrate.

It is preferable that the above-described wafer for an active layer be a SOI wafer having an insulation layer and an active layer (semiconductor layer constituting an active region in a semiconductor device), and an oxygen concentration of the active layer of the SOI wafer be not higher than $1.0 \times 10^{18}$ atoms/cm$^3$ (Old ASTM). In this case, the insulation film layer of the SOI wafer used as the wafer for an active layer may be used as a stop layer for polishing or etching during the step of thinning the bonded wafer (state D of FIG. 1) after bonding the wafers. As a method for reducing the oxygen concentration of the active layer, for example, it is possible to apply the above described heat treatment in an Ar gas atmosphere.

In the above-described bonded wafer 4, the wafer 2' for an active layer and the wafer 3' for a substrate may be constituted of wafers having different crystal orientations. For example, two wafers have different crystal orientations in the bonded interface, when a (110) crystal (crystal having a (110) plane as a surface plane to be bonded) and a (100) crystal is bonded, or a (111) crystal and a (100) crystal are bonded. A crystal orientation of a wafer may be controlled by growing a single crystal while controlling the pulling axis (growth axis) to correspond to a predetermined crystal orientation, and slicing a wafer from the obtained single crystal.

It is effective to have the bonded surfaces of the wafer 2' for an active layer and the wafer 3' for a substrate as hydrophobic surfaces. In this case, from the wafer 2' for an active layer and the wafer 3' for a substrate each having an oxygen concentration of $1.0 \times 10^{18}$ atoms/cm$^3$ (Old ASTM) or less in the surface portions, oxide layers in the bond surface are further removed. Therefore, the oxygen concentration is further reduced and generation of island oxide is further reduced. Here, the hydrophobic surface denotes a surface where a natural oxide film does not exist. For example, it is possible to obtain a hydrophobic surface by dipping the wafer in a HF solution, thereby removing a natural oxide film.

Accordingly, a method of producing a bonded wafer according to the present invention may comprise a step of performing a hydrophobic treatment on surfaces of the wafer 2' for an active layer and the wafer 3' for a substrate. For example, the hydrophobic treatment may be a step of removing a natural oxide film from a wafer by dipping the wafer in a HF solution.

A conventional method may be applied for bonding the wafer 2' for an active layer and the wafer 3' for a substrate. For example, by joining a wafer 2' for an active layer and the wafer 3' for a substrate, and performing a heat treatment at a predetermined temperature (for example, 1100 to 1200° C.), covalent bond is formed between the semiconductor materials constituting the two wafers, thereby bonding the wafer 2' for an active layer and the wafer 3' for a substrate.

A method of thinning the active layer 5 of the bonded wafer (state D of FIG. 1) is not limited provided that the method can be applied to work the wafer 2' for an active layer into a thin film by grinding or by delaminating the wafer 2'. It is preferable to perform the thinning using an ion implantation separation method. The ion implantation separation method has advantages. For example, the ion implantation method is cost effective since the separated portion may be recycled. In addition, a constant film thickness is provided to the bonded wafer without perform grinding. In the ion implantation separation method, before bonding the wafers, light element gas such as hydrogen gas or helium gas is implanted to the wafer 2' for the active layer thereby forming an ion-implanted layer in a predetermined depth from the surface of the wafer 2' for the active layer. Next, after bonding the wafer 3' for a substrate and the wafer 2' for an active layer, the bonded wafer is subjected to a heat treatment at a temperature ranging from 450° C. to 600° C., preferably at about 500° C., and the wafer 2' for an active layer is separated at the ion-implanted layer.

It is preferable that the thickness of the active layer 5 of the above-described bonded wafer be given a thickness in a range from 50 nm to 100 nm by the thinning.

In the present invention, the oxygen concentration of surfaces of the wafer for an active layer and the wafer for a substrate before bonding is controlled to be not higher than $1.0 \times 10^{18}$ atoms/cm$^3$ (Old ASTM). It is preferable to control the oxygen concentration of surfaces of the wafer for an active layer and the wafer for a substrate before bonding to be not higher than $1.0 \times 10^{17}$ atoms/cm$^3$ (Old ASTM). In this case, the numbers of island oxides can be further reduced. The lower limit of the oxygen concentration is not set since it is preferable to reduce the oxygen concentration to as low a value as possible. At present, it is considered that an oxygen concentration for a practically available wafer is limited to be not lower than about $1.0 \times 10^{15}$ atoms/cm$^3$ (Old ASTM).

In the wafer for an active layer and the wafer for a substrate which are subjected to bonding in the present invention, it is preferable to control the surface portion from the outermost surface of the bond surface to the depth of 0.5 µm, preferably to the depth of 1 µm, to have an oxygen concentration of not higher than $1.0 \times 10^{18}$ atoms/cm$^3$ (Old ASTM). By this configuration, it is possible to reduce the possibility that oxygen in the interior of the wafer condenses to the bonded interface, and therefore, it is possible to further reduce the numbers of island oxides. It is more preferable to control the portion deeper than 1 µm from the surface to have an oxygen concentration of not higher than $1.0 \times 10^{18}$ atoms/cm$^3$ (Old ASTM).

The above description of an embodiment of the present invention and various modifications may be made based on the scope of claims. For example, while the above-described embodiment explains a case of bonding a wafer for a substrate and a wafer for an active layer, it is also possible to bond two semiconductor wafers using the method of the present invention and subsequently form an additional semiconductor layer.

Example 1

Two semiconductor wafers were prepared as a wafer for an active layer and a wafer for a substrate. Each of the wafers had a diameter of 300 mm, surface orientation (wafer plane orientation) of (100), and a surface oxygen concentration of $1.3 \times 10^{18}$ atoms/cm$^3$ (Old ASTM). Both wafers were subjected to a heat treatment at 1100° C. in an Ar gas atmosphere (Ar annealing) such that the surface oxygen concentration of each of the wafers was reduced to $1.0 \times 10^{18}$ atoms/cm$^3$ (Old ASTM). After that, the thus heat-treated two high-temperature-annealed wafers were bonded directly without interposing an insulation film. So as to improve the bonding strength, the bonded wafer was subjected to a heat treatment at 1100° C. The wafer for the active layer was thinned by grinding and polishing, and the active layer was worked to a thin film of 100 nm or less.

Example 2

In Example 2, an SOI wafer was used as a wafer for the active layer, and an oxygen concentration of the active layer of the SOI wafer was controlled to be $1.0 \times 10^{18}$ atoms/cm$^3$ (Old ASTM) by performing a heat treatment at 1100° C. in an Ar gas atmosphere, Ar annealing was not performed. By using the other conditions the same as those in Example 1, a bonded wafer was produced.

Example 3

In Example 3, a wafer having a surface orientation of (100) plane was used as the wafer for a substrate, and a wafer having a surface orientation of (110) plane was used as the wafer for an active layer. Surface oxygen concentrations of the two wafers were controlled to be $1.0 \times 10^{18}$ atoms/cm$^3$ (Old ASTM) by controlling a rotation of a crucible while pulling silicon single crystals as raw materials of the wafers. Ar annealing of the two wafers was not performed. The other processes were the same as those in Example 1, and a bonded wafer was produced.

Example 4

In Example 4, surface oxygen concentrations of two wafers were controlled to be $1.0 \times 10^{18}$ atoms/cm$^3$ (Old ASTM) by controlling a rotation of a crucible while pulling silicon single crystal as a raw material of the wafers. Ar annealing was not performed on the two wafers. Before the bonding, both wafers were dipped in a HF solution composed of 1 vol % of HF and 99 vol % of $H_2O$. The other processes were the same as those in Example 1, and a bonded wafer was produced.

Comparative Example 1

In the Comparative Example 1, silicon wafers having a surface oxygen concentration of $1.1 \times 10^{18}$ atoms/cm$^3$ (Old ASTM) were used as the wafer for an active layer and a wafer for the supporting substrate. Heat treatment in an Ar gas atmosphere was not performed on the wafers. The other processes were the same as those in Example 1, and a bonded wafer was produced.

Evaluation Method

In each of the thus produced bonded wafers, the average number per 1 cm$^2$ of island oxides formed in the bonded interface was measured using an optical microscope. Sizes of the oxides were measured using a laser microscope. FIGS. 2A to 2D show the results of observation of numbers and sizes of the island oxides. Average numbers per 1 cm$^2$ and sizes of the island oxides in Examples 1 to 4 and Comparative Example 1 are shown in Table 1.

TABLE 1

|  | Average numbers of island oxides (particle/cm$^2$) | Sizes of island oxides (μm) |
| --- | --- | --- |
| Example 1 | 2.5/cm$^2$ | 500 to 1000 |
| Example 2 | 2.5/cm$^2$ | 500 to 800 |
| Example 3 | 2.5/cm$^2$ | 200 to 500 |
| Example 4 | 2.5/cm$^2$ | 100 to 200 |
| Comparative Example 1 | 5/cm$^2$ | 1500 to 2000 |

From the results shown in Table 1, it was confirmed that each of Examples 1 to 4 in which the surface oxygen concentrations of wafers were controlled to be not higher than $1.0 \times 10^{18}$ atoms/cm$^3$ showed satisfactory values of sizes and numbers of island oxides compared to the Comparative Example 1 in which the surface oxygen concentration of the wafers exceeded $1.0 \times 10^{18}$ atoms/cm$^3$. In the Examples 1 to 4, Example 4 in which the bonded surfaces were made to be hydrophobic surfaces showed an excellent effect of depressing the island oxides.

According to the present invention, it is possible to provide a method of producing a bonded wafer comprising a step of bonding a wafer for an active layer and a wafer for a substrate without interposing an insulation film in between, and a step of working the wafer for an active layer into a thin film, wherein surface portions at least including bonded surfaces of the first semiconductor wafer and the second semiconductor wafer have an oxygen concentration of $1.0 \times 10^{18}$ atoms/cm$^3$ (Old ASTM) or less. By this configuration, it was made possible to depress the formation of island oxides on the bonded interface.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a bonded wafer, comprising:
   performing heat treatment of a first semiconductor wafer and a second semiconductor wafer at a temperature in a range from 1100 to 1150° C. for a retention time in a range from 10 minutes to 2 hours in an Ar gas;
   performing bonding of the first semiconductor wafer and the second semiconductor wafer after the heat treatment without interposing an insulation film in between; and
   performing thinning of the second semiconductor wafer,
   wherein outermost surfaces of the first semiconductor wafer and the second semiconductor wafer before the bonding have an oxygen concentration of not higher than $1.0 \times 10^{17}$ atoms/cm$^3$ (Old ASTM), and surface portions from the outermost surfaces to the depth of 0.5 μm of the first semiconductor wafer and the second semiconductor wafer have an oxygen concentration of $1.0 \times 10^{18}$ atoms/cm$^3$ (Old ASTM) or less.

2. A method of producing a bonded wafer according to claim 1, wherein the second semiconductor wafer is a SOI wafer having an insulation layer and an active layer, and an oxygen concentration of the active layer of the SOI wafer is $1.0 \times 10^{18}$ atoms/cm$^3$ (Old ASTM) or less.

3. A method of producing a bonded wafer according to claim 2, wherein the first semiconductor wafer and the second semiconductor wafer have different crystal orientations.

4. A method of producing a bonded wafer according to claim 2, wherein bonded surfaces of the first semiconductor wafer and the second semiconductor wafer are hydrophobic surfaces.

5. A method of producing a bonded wafer according to claim 2, wherein the thinning of the second semiconductor wafer is performed by ion implantation separation method.

6. A method of producing a bonded wafer according to claim 1, wherein the first semiconductor wafer and the second semiconductor wafer have different crystal orientations.

7. A method of producing a bonded wafer according to claim 1, wherein bonded surfaces of the first semiconductor wafer and the second semiconductor wafer are hydrophobic surfaces.

8. A method of producing a bonded wafer according to claim 1, wherein the thinning of the second semiconductor wafer is performed by ion implantation separation method.

* * * * *